(12) United States Patent
Nishiura et al.

(10) Patent No.: US 11,921,132 B2
(45) Date of Patent: Mar. 5, 2024

(54) ANISOTROPIC CONDUCTIVE SHEET, ELECTRICAL INSPECTION DEVICE AND ELECTRICAL INSPECTION METHOD

(71) Applicant: Mitsui Chemicals, Inc., Tokyo (JP)

(72) Inventors: Katsunori Nishiura, Chiba (JP); Taichi Koyama, Yokohama (JP); Daisuke Yamada, Yokohama (JP)

(73) Assignee: Mitsui Chemicals, Inc., Tokyo (JP)

( * ) Notice: Subject to any disclaimer, the term of this patent is extended or adjusted under 35 U.S.C. 154(b) by 106 days.

(21) Appl. No.: 17/778,053

(22) PCT Filed: Nov. 19, 2020

(86) PCT No.: PCT/JP2020/043263
§ 371 (c)(1),
(2) Date: May 19, 2022

(87) PCT Pub. No.: WO2021/100824
PCT Pub. Date: May 27, 2021

(65) Prior Publication Data
US 2022/0413013 A1 Dec. 29, 2022

(30) Foreign Application Priority Data
Nov. 22, 2019 (JP) .................. 2019-211816

(51) Int. Cl.
*G01R 1/073* (2006.01)
*H01B 5/16* (2006.01)
*H01R 11/01* (2006.01)

(52) U.S. Cl.
CPC .............. *G01R 1/073* (2013.01); *H01B 5/16* (2013.01); *H01R 11/01* (2013.01)

(58) Field of Classification Search
CPC ........ G01R 1/073; G01R 1/0735; G01R 1/06; H01B 5/16; H01R 11/01; H01R 12/7076; H01R 2201/20
See application file for complete search history.

(56) References Cited

U.S. PATENT DOCUMENTS

| | | | |
|---|---|---|---|
| 2006/0160383 A1* | 7/2006 | Yamada | G01R 1/06755 439/86 |
| 2007/0160808 A1* | 7/2007 | Okuda | H01R 13/2414 428/137 |
| 2021/0104854 A1 | 4/2021 | Tsuchiya | |

FOREIGN PATENT DOCUMENTS

| | | |
|---|---|---|
| JP | 2005-050782 A | 2/2005 |
| JP | 2007-220512 A | 8/2007 |

(Continued)

OTHER PUBLICATIONS

International Search Report of PCT/JP2020/043263 dated Feb. 9, 2021.

*Primary Examiner* — G. M. A Hyder
(74) *Attorney, Agent, or Firm* — Shih IP Law Group, PLLC.

(57) ABSTRACT

An anisotropic conductive sheet according to the present invention comprises an insulating layer and a plurality of conductive layers. The insulating layer is elastic, and has a first surface that is positioned on one side in the thickness direction, a second surface that is positioned on the other side in the thickness direction, and a plurality of through holes that penetrate the layer from the first surface to the second surface. The conductive layers are respectively arranged on the inner wall surfaces of the plurality of through holes. The insulating layer comprises an elastic layer that is formed of a crosslinked product of an elastomer composition, and a heat-resistant resin layer that is formed of a heat-resistant resin composition that has a higher glass (Continued)

transition temperature than the crosslinked product of an elastomer composition.

21 Claims, 11 Drawing Sheets

(56) References Cited

FOREIGN PATENT DOCUMENTS

| | | |
|---|---|---|
| JP | 2009-076443 A | 4/2009 |
| JP | 2010-153263 A | 7/2010 |
| WO | 2007023596 A1 | 3/2007 |
| WO | 2018/212277 A1 | 11/2018 |

* cited by examiner

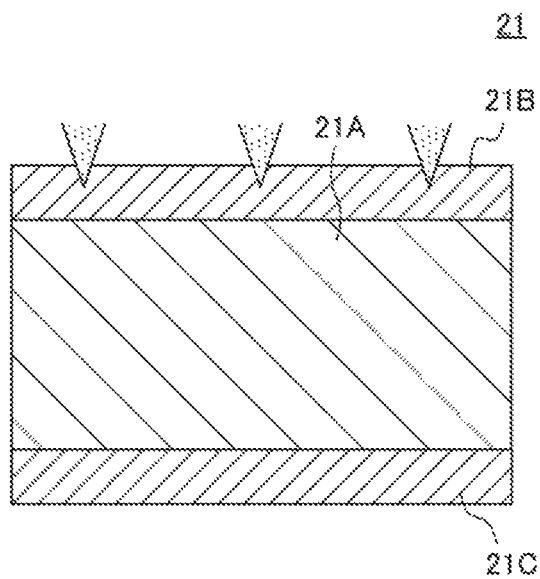
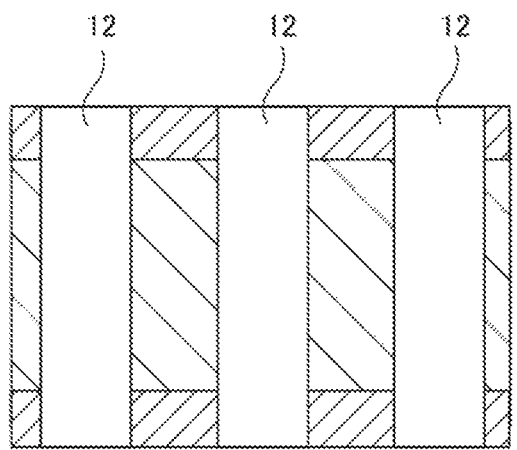
FIG. 3A
FIG. 3B
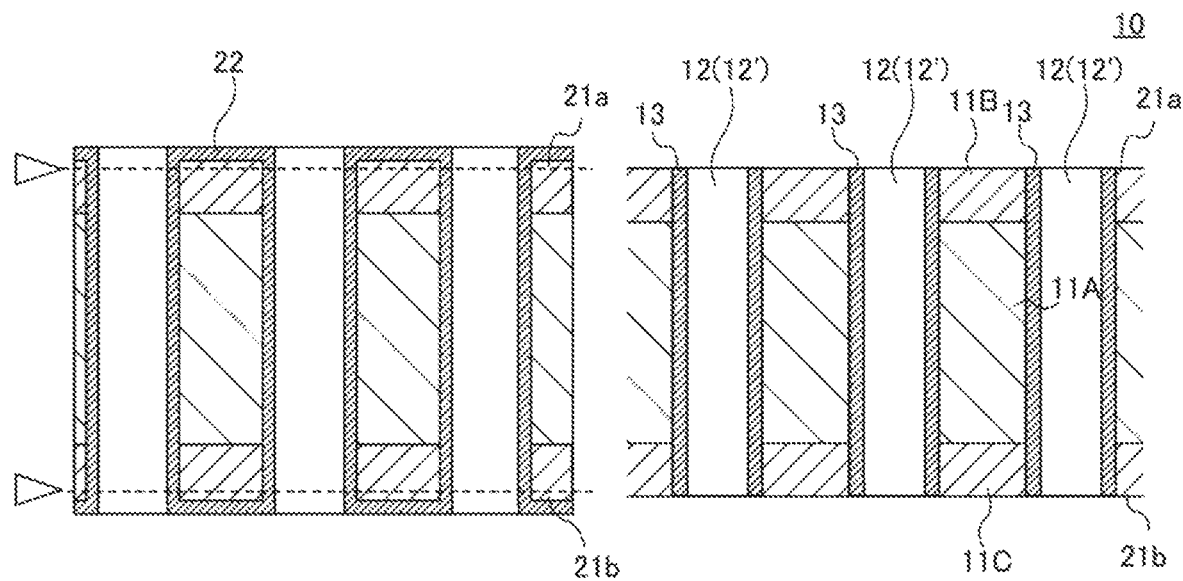
FIG. 3C
FIG. 3D

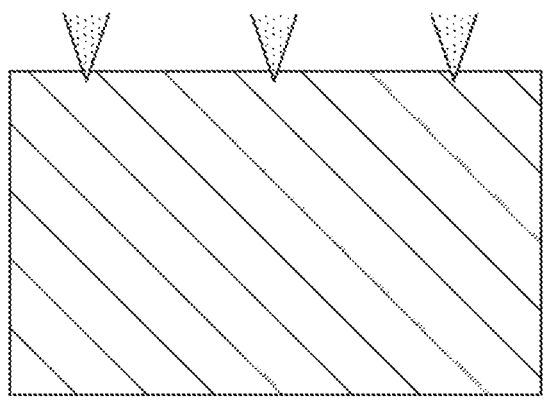
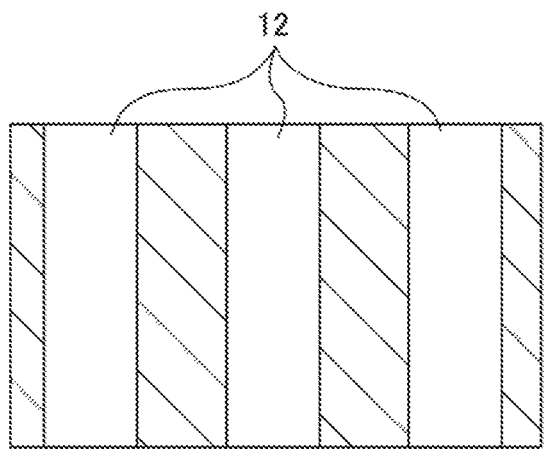
FIG. 8A  FIG. 8B
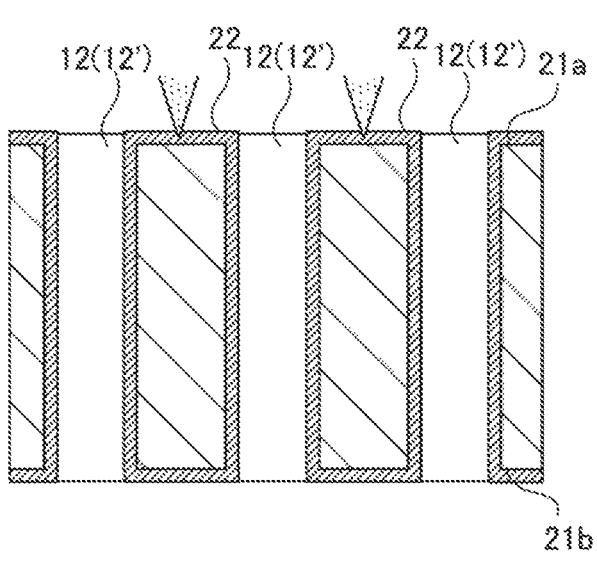
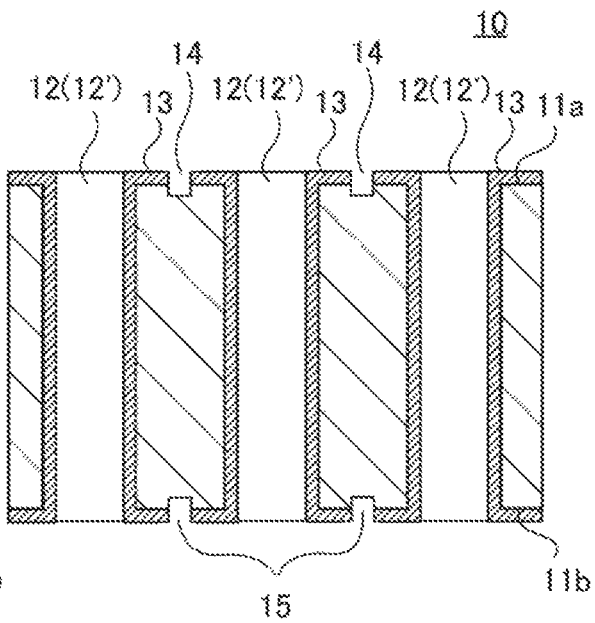
FIG. 8C  FIG. 8D

ANISOTROPIC CONDUCTIVE SHEET, ELECTRICAL INSPECTION DEVICE AND ELECTRICAL INSPECTION METHOD

TECHNICAL FIELD

The present invention relates to an anisotropic conductive sheet, an electrical testing apparatus and an electrical testing method.

BACKGROUND ART

Semiconductor devices such as printed circuit boards mounted in electronic products are usually subjected to electrical testing. Usually, electrical testing is performed by electrically contacting a substrate (with an electrode) of an electrical testing apparatus and a terminal of an inspection object such as a semiconductor device, and reading the current obtained when a predetermined voltage is applied between the terminals of the inspection object. Then, for the purpose of reliably performing the electrical contact between the electrode of the substrate of the electrical testing apparatus and the terminal of the inspection object, an anisotropic conductive sheet is disposed between the substrate of the electrical testing apparatus and the inspection object.

The anisotropic conductive sheet is a sheet that has conductivity in the thickness direction and insulating properties in the surface direction, and is used as a probe (contact) in electrical testing. In particular, for the purpose of reliably performing the electrical connection between the substrate of the electrical testing apparatus and the inspection object, an anisotropic conductive sheet that elastically deforms in the thickness direction is desired.

As an anisotropic conductive sheet that elastically deforms in the thickness direction, an electric connector including an elastic body (for example, a silicone rubber sheet) including a plurality of through holes extending in the thickness direction and a plurality of hollow conductive members joined on the inner wall surface of the through hole is known (see, for example, PTL 1). In addition, an anisotropic conductive sheet including a sheet (such as a polyolefin porous sheet and a PEFE film) including a plurality of through holes extending in the thickness direction, and a plurality of conduction parts formed by plating at the inner wall surface of the through hole is known (see, for example, PTLS 2 and 3).

CITATION LIST

Patent Literature

PTL 1
WO2018/212277
PTL 2
Japanese Patent Application Laid-Open No. 2007-220512
PTL 3
Japanese Patent Application Laid-Open No. 2010-153263

SUMMARY OF INVENTION

Technical Problem

In PTL 1, however, the insulation layer is composed of silicone rubber, and consequently the anisotropic conductive sheet is excessively soft and has no stiffness, resulting in poor handleability. In addition, since the coefficient of thermal expansion (CTE) of silicone rubber is high, the pitches of a plurality of conductive paths are easily changed when heated during electrical testing. In PTLS 2 and 3, on the other hand, since the insulation layer does not include elastomer, the deformation (elastically deformation) in the thickness direction is insufficient, and consequently sufficient electrical connection between the substrate of the electrical testing apparatus and the inspection object cannot be performed.

In addition, in the anisotropic conductive sheets disclosed in PTLS 1 to 3, the conductive layer is provided at the inner wall surface of the through hole, but the conductive layer is not provided at the surface of the sheet, and consequently sufficient electrical connection between the substrate of the electrical testing apparatus and the inspection object cannot be performed.

To solve the above-mentioned problems, a first object of the present invention is to provide an anisotropic conductive sheet that can sufficiently deform in the thickness direction and can reduce variation of the pitch between a plurality of conductive paths due to heat, with favorable handleability, and an electrical testing apparatus and an electrical testing method. In addition, a second object is to provide an anisotropic conductive sheet that can sufficiently deform in the thickness direction and can perform sufficient electrical connection between the substrate of the electrical testing apparatus and the inspection object, with a low electric resistance value.

Solution to Problem

The above-mentioned objects can be solved with the following configurations.

An anisotropic conductive sheet of a first aspect of the present invention includes: an insulation layer with elasticity including a first surface located on one side in a thickness direction, a second surface located on another side in the thickness direction, and a plurality of through holes extending between the first surface and the second surface; and a plurality of conductive layers disposed at inner wall surfaces of the plurality of through holes. The insulation layer includes: an elastic body layer including a cross-linked elastomer composition, and a heat-resistant resin layer including a heat-resistant resin composition with a glass transition temperature higher than that of the cross-linked elastomer composition.

An anisotropic conductive sheet of a second aspect of the present invention includes: an insulation layer with elasticity including a first surface located on one side in a thickness direction, a second surface located on another side in the thickness direction, and a plurality of through holes extending between the first surface and the second surface; a plurality of conductive layers disposed continuously to an inner wall surface of each of the plurality of through holes and a periphery of an opening of each of the plurality of through holes on the first surface in the plurality of through holes; and a plurality of first groove parts disposed between the plurality of conductive layers on the first surface, and configured to insulate the plurality of conductive layers.

An electrical testing apparatus of an embodiment the present invention includes: an inspection substrate including a plurality of electrodes; and the anisotropic conductive sheet disposed on a surface where the plurality of electrodes is disposed in the inspection substrate.

An electrical testing method according to an embodiment of the present invention, comprising: stacking an inspection substrate including a plurality of electrodes and an inspection object including a terminal through the anisotropic conductive sheet, and electrically connecting the plurality of electrodes of the inspection substrate and the terminal of the inspection object through the anisotropic conductive sheet.

Advantageous Effects of Invention

According to the first aspect of the present invention, it is possible to provide an anisotropic conductive sheet that can sufficiently deform in the thickness direction and can reduce variation of the pitch between a plurality of conductive paths due to heat, with favorable handleability, and an electrical testing apparatus and an electrical testing method. In addition, according to the second aspect of the present invention, it is possible to provide an anisotropic conductive sheet that can sufficiently deform in the thickness direction and can perform sufficient electrical connection between the substrate of the electrical testing apparatus and the inspection object, with a low electric resistance value.

BRIEF DESCRIPTION OF DRAWINGS

FIGS. 3A to 3D are schematic cross-sectional views illustrating a manufacturing method for the anisotropic conductive sheet according to Embodiment 1;

FIGS. 8A to 8D are schematic cross-sectional views illustrating a manufacturing method for the anisotropic conductive sheet according to Embodiment 2;

DESCRIPTION OF EMBODIMENTS

Embodiment 1

1. Anisotropic Conductive Sheet

Anisotropic conductive sheet 10 according to the present embodiment relates to a first anisotropic conductive sheet of an embodiment of the present invention.

Figure 1A:
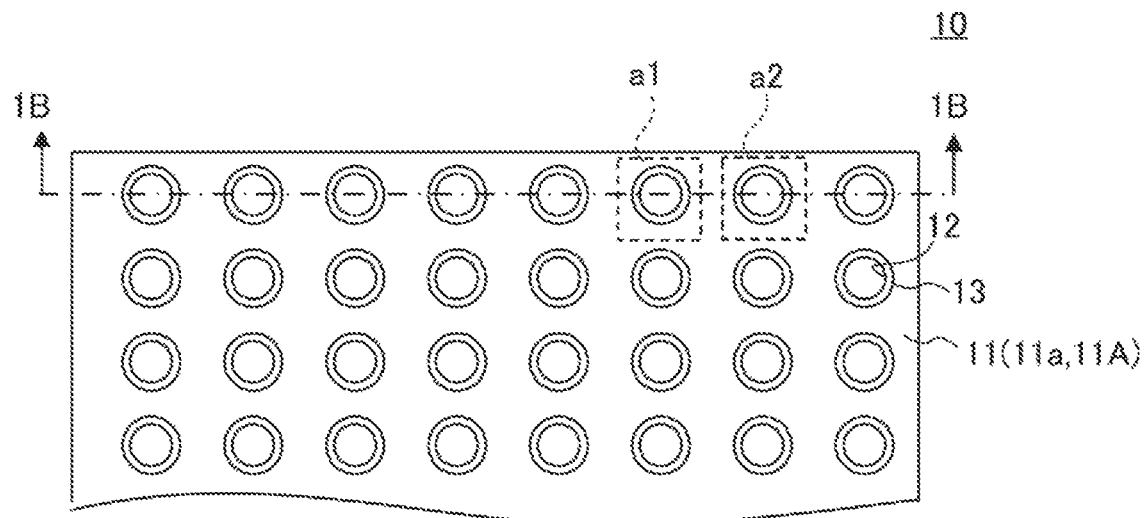
FIG. 1A is a plan view illustrating an anisotropic conductive sheet according to Embodiment 1.
Figure 1B:
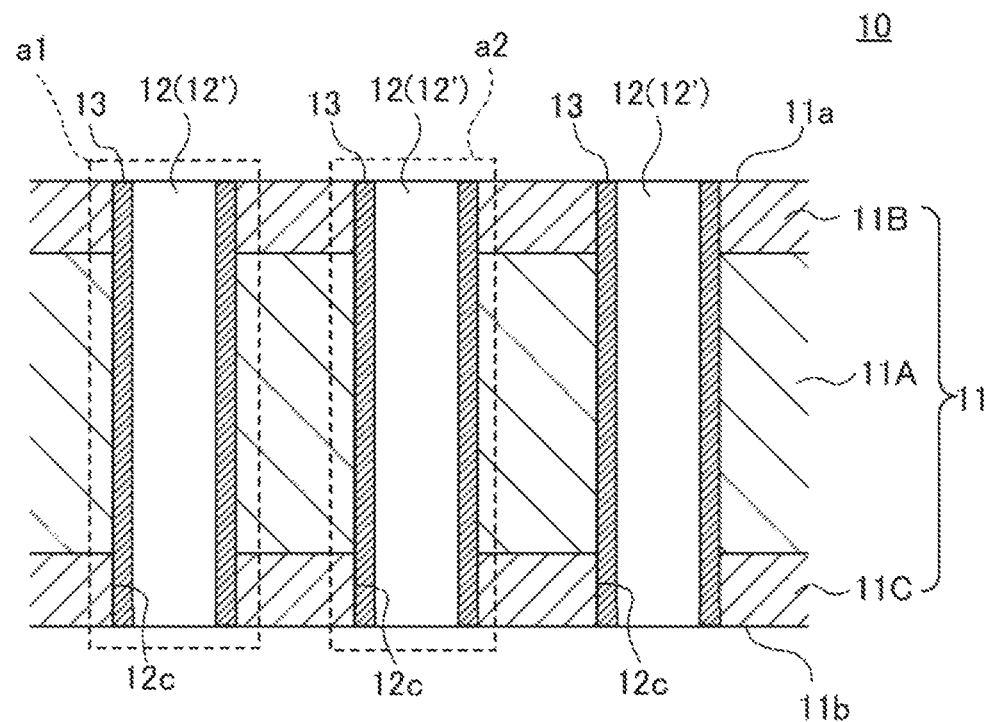
FIG. 1B is a partially enlarged sectional view of the anisotropic conductive sheet of FIG. 1A taken along line 1B-1B.
Figure 2:
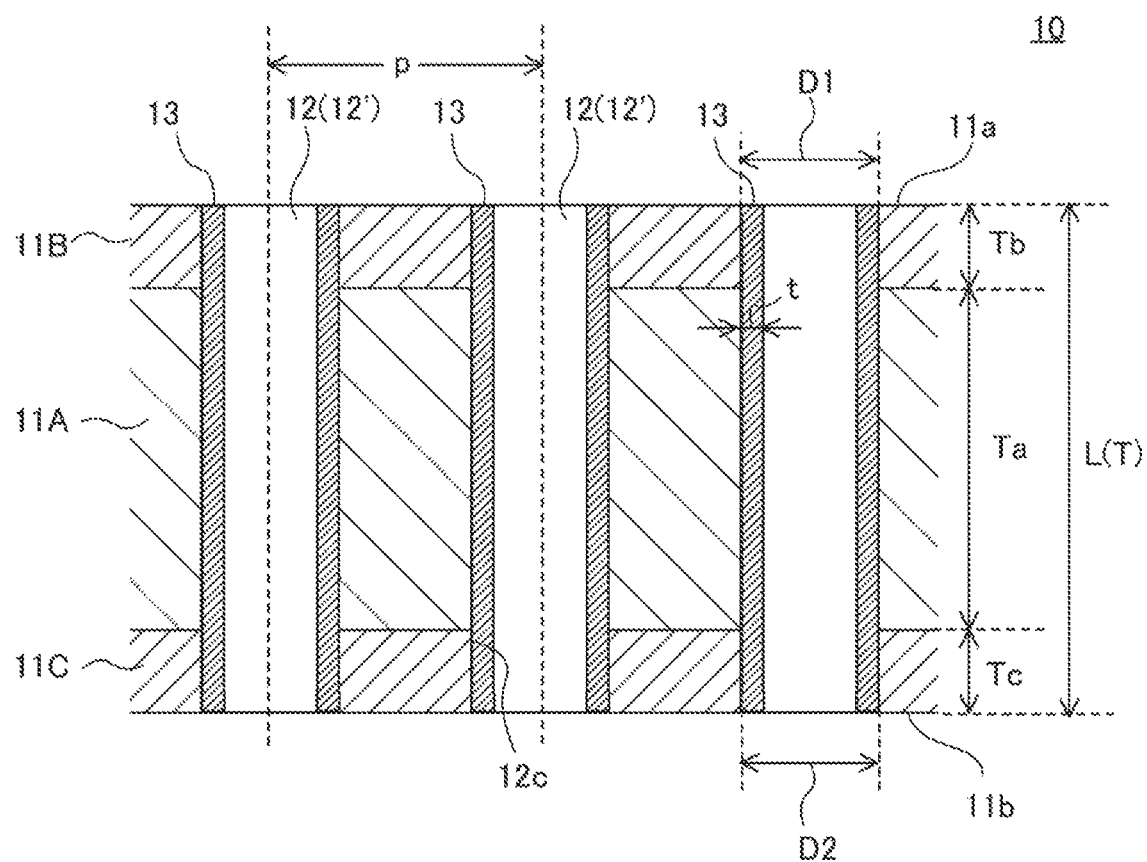
FIG. 2 is an enlarged view of FIG. 1B.

FIG. 1A is a plan view of anisotropic conductive sheet 10 according to Embodiment 1, and FIG. 1B is a partially enlarged sectional view of anisotropic conductive sheet 10 of FIG. 1A taken along line 1B-1B. FIG. 2 is an enlarged view of FIG. 1B.

As illustrated in FIGS. 1A and 1B, anisotropic conductive sheet 10 includes insulation layer 11 including a plurality of through holes 12, and a plurality of conductive layers 13 (see, for example, the two conductive layers 13 surrounded by the broken line in FIG. 1B) corresponding to the plurality of through holes 12. Anisotropic conductive sheet 10 includes a plurality of hollows 12' surrounded by conductive layer 13.

In the present embodiment, it is preferable that the inspection object be disposed at first surface 11a (one surface of anisotropic conductive sheet 10) of insulation layer 11.

1-1. Insulation Layer 11

Insulation layer 11 includes first surface 11a located on one side in the thickness direction, second surface 11b located on the other side in the thickness direction, and the plurality of through holes 12 extending between first surface 11a and second surface 11b (see FIGS. 1A and 1B).

Through hole 12 holds conductive layer 13 at its inner wall surface and increases the flexibility of insulation layer 11 so that it is easily deformed in the thickness direction of insulation layer 11.

The shape of through hole 12 may be a columnar shape. The cross-sectional shape of through hole 12 in the direction orthogonal to the axis direction is not limited, and may be, for example, a circular shape, an ellipse shape, a quadrangular shape, or other polygonal shapes. The first surface 11a side cross-sectional shape and the second surface 11b side cross-sectional shape of through hole 12 may be identical to each other or different from each other, while it is preferable that they be identical to each other from the viewpoint of the stability of the connection to the electronic device as the measurement target.

For example, the shape of through hole 12 may be a columnar shape or a prismatic shape. In the present embodiment, the shape of through hole 12 is a columnar shape. In addition, the circle equivalent diameter of through hole 12 in the cross section orthogonal to the axis direction may be constant or vary in the axial direction. The axial direction is a direction of a line connecting the center of the opening on the first surface 11a side and the center of the opening on second surface 11b side of through hole 12.

Circle equivalent diameter D1 of the opening of through hole 12 on first surface 11a side is not limited as long as center-to-center distance (pitch) p of the openings of the plurality of through holes 12 falls within a range describe later, and the diameter is preferably 1 to 330 μm, or more preferably 3 to 55 μm (see FIG. 2), for example. Circle equivalent diameter D1 of the opening of through hole 12 on first surface 11a side is the circle equivalent diameter of the opening of through hole 12 as viewed along the axis direction of through hole 12 from first surface 11a side.

Circle equivalent diameter D1 of the opening of through hole 12 on first surface 11a side and circle equivalent diameter D2 of the opening of through hole 12 on second surface 11b side may be identical to each other or different from each other. In the case where the circle equivalent diameter of the opening of through hole 12 is different between first surface 11a side and second surface 11b side, the ratio the diameters (circle equivalent diameter D1 of the opening on the first surface 11a side/circle equivalent diameter D2 of the opening on second surface 11b side) is, for example, 0.5 to 2.5, while the ratio is preferably 0.6 to 2.0, more preferably 0.7 to 1.5.

Center-to-center distance (pitch) p of the openings of the plurality of through holes 12 on first surface 11a side is not limited, and may be appropriately set in accordance with the pitch of the terminal of the inspection object (see FIG. 2).

The pitch of a terminal of a high bandwidth memory (HBM) as an inspection object is 55 µm, and the pitch of a terminal of a package on package (PoP) is 400 to 650 µm, and accordingly, center-to-center distance p of the openings of the plurality of through holes 12 may be 5 to 650 µm, for example. In particular, from the view point of eliminating the need for the alignment of the terminal of the inspection object (from the view point of achieving alignment free), it is preferable that center-to-center distance p of the openings of the plurality of through holes 12 on first surface 11a side be 5 to 55 µm. Center-to-center distance p of the openings of the plurality of through holes 12 on the first surface 11a side is the minimum value of the center-to-center distances of the openings of the plurality of through holes 12 on the first surface 11a side. The center of the opening of through hole 12 is the center of gravity of the opening. In addition, center-to-center distance p of the openings of the plurality of through holes 12 may be constant or vary in the axial direction.

The ratio (L/D1) of axial length L of through hole 12 (thickness T of first insulation layer 11) and circle equivalent diameter D1 of the opening of through hole 12 on first surface 11a side is not limited, while it is preferably 3 to 40 (see FIG. 2).

Insulation layer 11 has elasticity to allow for elastic deformation when a pressure is applied in the thickness direction. Specifically, preferably, insulation layer 11 includes at least an elastic body layer composed of a cross-linked elastomer composition, and further includes a heat-resistant resin layer composed of a heat-resistant resin composition with a glass transition temperature higher than that of the cross-linked elastomer composition, to the extent that the overall elasticity is not compromised.

One, or two or more, heat-resistant resin layers may be provided. In the present embodiment, the heat-resistant resin layer includes first heat-resistant resin layer 11B and second heat-resistant resin layer 11C (see FIG. 1B). Specifically, in the present embodiment, insulation layer 11 includes elastic body layer 11A, first heat-resistant resin layer 11B and second heat-resistant resin layer 11C (see FIG. 1B).

Elastic Body Layer 11A

Elastic body layer 11A is composed of the cross-linked elastomer composition, and functions as the base material (elastic body layer) of insulation layer 11. The crosslinking product may be a partially cross-linked product.

From the viewpoint of increasing the damage resistance of the terminal of the inspection object, it is preferable that the glass transition temperature of the cross-linked elastomer composition making up elastic body layer 11A be lower than the glass transition temperature of the heat-resistant resin composition making up first heat-resistant resin layer 11B or second heat-resistant resin layer 11C. More specifically, the glass transition temperature of the cross-linked elastomer composition making up elastic body layer 11A is preferably −40° C. or lower, more preferably −50° C. or lower. The glass transition temperature can be measured in compliance with JIS K 7095:2012.

In addition, preferably, the coefficient of thermal expansion (CTE) of the cross-linked elastomer composition making up elastic body layer 11A is higher than the coefficient of thermal expansion (CTE) of the heat-resistant resin composition making up first heat-resistant resin layer 11B or second heat-resistant resin layer 11C. More specifically, the coefficient of thermal expansion of the cross-linked elastomer composition making up elastic body layer 11A is normally higher than 60 ppm/K, and may be 200 ppm/K or greater, for example. The coefficient of thermal expansion can be measured in compliance with JIS In addition, the storage modulus at 25° C. of the cross-linked elastomer composition making up elastic body layer 11A is preferably $1.0 \times 10^7$ Pa or smaller, more preferably $1.0 \times 10^5$ to $9.0 \times 10^6$ Pa. The storage modulus of elastic body can be measured in compliance with JIS K 7244-1:1998/ISO6721-1:1994.

The glass transition temperature, the coefficient of thermal expansion and the storage modulus of the cross-linked elastomer composition can be adjusted by the composition of the elastomer composition. In addition, the storage modulus of elastic body layer 11A is adjusted also by its form (whether it is porous).

While the elastomer in the elastomer composition is not limited as long as it has insulating properties and the glass transition temperature, the coefficient of thermal expansion or the storage modulus of the cross-linked elastomer composition falls within the above-mentioned range, preferable examples of the elastomer in the elastomer composition include silicone rubber, urethane rubber (urethane polymer), acrylic rubber (acrylic polymer), ethylene-propylene-diene copolymer (EPDM), chloroprene rubber, styrene-butadiene copolymer, acrylic nitrile-butadiene copolymer, poly butadiene rubber, natural rubber, polyester thermoplastic elastomer, olefin thermoplastic elastomer, fluorine-based rubber and other elastomers. Among them, silicone rubber is especially preferable.

The elastomer composition may further include crosslinking agent as necessary. The crosslinking agent is appropriately selected in accordance with the type of the elastomer. For example, examples of the crosslinking agent of the silicone rubber include addition reaction catalysts such as metals, metal compounds, and metal complexes (platinum, platinum compounds, and their complexes) having catalytic activity for hydrosilylation reactions; and organic peroxides such as benzoyl peroxide, bis-2,4-dichlorobenzoyl peroxide, dicumylperoxide, and di-t-butyl peroxide. Examples of the crosslinking agent for acrylic rubber (acrylic polymer) include epoxy compounds, melamine compounds, and isocyanate compounds.

Examples of the cross-linked silicone rubber composition include addition cross-linked silicone rubber composition containing organopolysiloxane with hydrosilyl group (SiH group), organopolysiloxane with vinyl group, and addition reaction catalyst, addition cross-linked silicone rubber composition containing organopolysiloxane with vinyl groups and addition reaction catalyst; cross-linked silicone rubber composition containing organopolysiloxane with $SiCH_3$ groups and organic peroxide curing agent, and the like.

From the viewpoint of adjusting the adhesion and the storage modulus within the above-mentioned range and the like, the elastomer composition may include other components such as adhesion-imparting agent, silane coupling agent, and filler.

From the viewpoint of adjustability of the storage modulus within the above-mentioned range, elastic body layer 11A may be porous, for example. That is, porous silicone may be used.

First Heat-Resistant Resin Layer 11B and Second Heat-Resistant Resin Layer 11C

Each of first heat-resistant resin layer 11B and second heat-resistant resin layer 11C is composed of the heat-resistant resin composition. The heat-resistant resin composition making up first heat-resistant resin layer 11B and the heat-resistant resin composition making up second heat-resistant resin layer 11C may be identical to each other or different from each other.

Preferably, the heat-resistant resin composition making up first heat-resistant resin layer 11B or second heat-resistant resin layer 11C has a glass transition temperature higher than that of the cross-linked elastomer composition making up elastic body layer 11A. More specifically, since electrical testing is performed at approximately −40 to 150° C., the glass transition temperature of the heat-resistant resin composition is preferably 150° C. or above, more preferably 150 to 500° C. The glass transition temperature of the heat-resistant resin composition can be measured by a method similar to the above-mentioned method.

In addition, preferably, the heat-resistant resin composition making up first heat-resistant resin layer 11B or second heat-resistant resin layer 11C has a coefficient of thermal expansion lower than that of the cross-linked elastomer composition making up elastic body layer 11A. More specifically, the coefficient of thermal expansion of the heat-resistant resin composition making up first heat-resistant resin layer 11B or second heat-resistant resin layer 11C is preferably 60 ppm/K or smaller, more preferably 50 ppm/K or smaller.

In addition, since first heat-resistant resin layer 11B or second heat-resistant resin layer 11C is immersed in chemical liquid in an electroless plating process and the like, it is preferable that the heat-resistant resin composition making up them have chemical resistance, for example.

In addition, preferably, the heat-resistant resin composition making up first heat-resistant resin layer 11B or second heat-resistant resin layer 11C has a storage modulus higher than that of the cross-linked elastomer composition making up elastic body layer 11A.

The composition of the heat-resistant resin composition is not limited as long as the glass transition temperature, the coefficient of thermal expansion or the storage modulus satisfies the above-mentioned range, and it has a chemical resistance. Examples of the resin in the heat-resistant resin composition include engineering plastics such as polyamide, polycarbonate, polyarylate, polysulfone, polyether sulfone, polyphenylene sulfide, polyetheretherketone, polyimide and polyetherimide, acrylic resin, urethane resin, epoxy resin, and olefin resin. The heat-resistant resin composition may further include other components such as filler as necessary.

Common Matter

Insulation layer 11 may further include layers other than the above-mentioned layers as necessary. Examples of the other layers include bonding layer 11D disposed between the two elastic body layers 11A and 11A (see FIG. 9A described later).

The thickness of insulation layer 11 is not limited as long as it can ensure the insulating properties at the non-conduction portion, and the thickness may be, for example, 40 to 500 μm, preferably 100 to 300 μm.

Thickness Tb of first heat-resistant resin layer 11B (or thickness Tc of second heat-resistant resin layer 11C) is not limited, while it is preferably smaller than thickness Ta of elastic body layer 11A from the viewpoint of making the elasticity of insulation layer 11 less impaired (see FIG. 2). More specifically, the ratio (Tb/Ta or Tc/Ta) of thickness Tb of first heat-resistant resin layer 11B (or thickness Tc of second heat-resistant resin layer 11C) to thickness Ta of elastic body layer 11A is preferably 3/97 to 30/70, more preferably 10/90 to 20/80, for example. In the case where the proportion of the thickness of first heat-resistant resin layer 11B (or second heat-resistant resin layer 11C) is equal to or greater than a certain value, appropriate hardness (stiffness) that does not impair the elasticity (deformability) of insulation layer 11 can be provided to insulation layer 11. This can not only increase the handleability, but also reduce fracture of conductive layer 13 due to expansion and contraction of insulation layer 11 and the like and variation of the center-to-center distance of the plurality of through holes 12 due to heat.

Preferably, thickness Tb of first heat-resistant resin layer 11B and thickness Tc of second heat-resistant resin layer 11C are equal to each other from the viewpoint of reducing warp of anisotropic conductive sheet 10 and the like, for example. Preferably, the ratio (Tb/Tc) of thickness Tb of first heat-resistant resin layer 11B to thickness Tc of second heat-resistant resin layer 11C is 0.8 to 1.2, for example.

1-2. Conductive Layer 13

Conductive layer 13 is disposed at inner wall surface 12c of through hole 12. Conductive layer 13 of the unit surrounded by the broken line functions as a conductive path (see FIG. 1B).

The volume resistivity of the material of conductive layer 13 is not limited as long as sufficient conduction can be obtained, and for example, the volume resistivity is preferably $1.0 \times 10^{-4}$ Ω·m or smaller, more preferably $1.0 \times 10^{-6}$ to $1.0 \times 10^{-9}$ Ω·m. The volume resistivity of the material of conductive layer 13 can be measured by the method described in ASTM D 991.

It suffices that the volume resistivity of the material of conductive layer 13 falls within the above-mentioned range. Examples of the material of conductive layer 13 include metal materials such as copper, gold, platinum, silver, nickel, tin, iron or an alloy of one of them, and carbon materials such as carbon black.

The thickness of conductive layer 13 is not limited as long as sufficient conduction can be obtained. More specifically, the thickness of conductive layer 13 may be 0.1 to 5 μm. When the thickness of conductive layer 13 has a certain value or greater, sufficient conduction is easily achieved; however, when the thickness has a value smaller than a certain value, through hole 12 may be closed, and the terminal of the inspection object may be damaged due to contact with conductive layer 13. Note that thickness t of conductive layer 13 is the thickness in the direction orthogonal to the thickness direction of insulation layer 11 (see FIG. 2).

The shape of hollow 12' surrounded by conductive layer 13 on first surface 11a side corresponds to the shape of through hole 12, and has a columnar shape. That is, the cross-sectional shape of hollow 12' in the direction orthogonal to the axis direction is the same as the shape of through hole 12 in the cross section orthogonal to the axis direction.

The circle equivalent diameter of hollow 12' is obtained by subtracting the thickness of conductive layer 13 from circle equivalent diameter D1 of the opening of through hole 12 on first surface 11a side, and may be 1 to 330 μm, for example.

1-3. Effects

Anisotropic conductive sheet 10 of the present embodiment (the first anisotropic conductive sheet of the embodiment of the present invention) includes the plurality of hollows 12' surrounded by conductive layer 13 (hollow derived from through hole 12). In this manner, anisotropic conductive sheet 10 can be favorably deformed when a pressure is applied in the thickness direction. In addition, insulation layer 11 includes elastic body layer 11A with high elasticity, and first heat-resistant resin layer 11B or second heat-resistant resin layer 11C with high heat resisting properties (or low coefficient of thermal expansion). In this manner, appropriate hardness (stiffness) can be provided to insulation layer 11 without impairing the elasticity (deformability) of insulation layer 11. This can not only increase handleability, but also reduce fracture of conductive layer 13 due to expansion and contraction of insulation layer 11 due to heat and the like and variation of the center-to-center distance of the plurality of through holes 12 due to heat.

In addition, in the present embodiment, first surface 11a where conductive layer 13 is disposed is composed of first heat-resistant resin layer 11B. In this manner, favorable adhesion with conductive layer 13 can be more easily achieved in comparison with the case where first surface 11a is composed of elastic body layer 11A.

2. Manufacturing Method for Anisotropic Conductive Sheet

Figure 4:
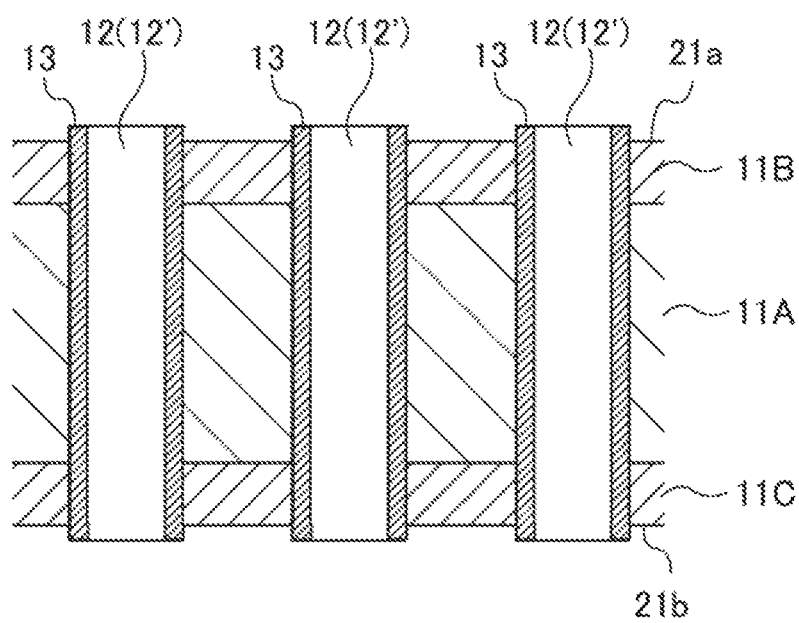
FIG. 4 is a schematic cross-sectional view illustrating a manufacturing method for an anisotropic conductive sheet according to a modification.

FIGS. 3A to 3D are schematic cross-sectional views illustrating a manufacturing method of anisotropic conductive sheet 10 according to the present embodiment. FIG. 4 is a schematic cross-sectional view illustrating a manufacturing method of anisotropic conductive sheet 10 according to a modification.

Anisotropic conductive sheet 10 according to the present embodiment is manufactured through a step 1) of preparing a laminate sheet as an insulating sheet (see FIG. 3A), a step 2) of forming the plurality of through holes 12 in insulating sheet 21 (see FIG. 3B), a step 3) of forming conductive layer 22 in the surface of insulating sheet 21 where the plurality of through holes 12 is formed, and a step 4) of forming the plurality of conductive layers 13 by removing a part on first surface 21a side and a part on second surface 21b side of insulating sheet 21 (see FIG. 3D), for example.

Step 1

First, as insulating sheet 21, a laminate sheet including elastic body layer 21A and two heat-resistant resin layers 21B and 21C stacked to sandwich elastic body layer 21A is prepared.

The laminate sheet can be manufactured by any method. For example, the laminate sheet may be obtained by preparing a first laminate including heat-resistant resin layer 21B, elastic body layer 21A and a bonding layer (not illustrated in the drawing) in this order, and a second laminate including heat-resistant resin layer 21C, elastic body layer 21A and a bonding layer (not illustrated in the drawing) in this order, and by bonding the bonding layer of the first laminate and the bonding layer of the second laminate to each other through thermo compression bonding.

The material of the sacrificial layer may be or may not be identical to the heat-resistant resin composition.

Step 2

Next, the plurality of through holes 12 is formed in insulating sheet 21.

Through hole 12 may be formed by any methods. For example, a method of mechanically forming a hole (for example, pressing and punching), and a laser processing method may be used. Among them, it is preferable to use a laser processing method to form through hole 12 from the viewpoint of forming through hole 12 with fine and high shape accuracy (see FIG. 3A).

The lasers can be excimer lasers, femtosecond lasers, carbon dioxide lasers, YAG lasers, etc., which can puncture resins with high precision. Among them, femtosecond lasers are preferred.

Note that in laser processing, the diameter of the opening of through hole 12 tends to become large at the laser irradiation surface of insulation layer 11 where the irradiation time of laser is longest. Specifically, it tends to have a tapered shape whose the opening diameter increases from the inside of insulation layer 11 toward the laser irradiation surface. From the viewpoint of reducing such a tapered shape, the laser processing may be performed by using insulating sheet 21 further including a sacrificial layer (not illustrated in the drawing) at the surface to be irradiated with laser. The laser processing method for insulating sheet 21 including the sacrificial layer may be performed by a method similar to the method disclosed in WO2007/23596.

Step 3

Next, one continuous conductive layer 22 is formed at the entire surface of insulating sheet 21 where the plurality of through holes 12 is formed (see FIG. 3C). More specifically, conductive layer 22 is continuously formed in insulating sheet 21, at inner wall surface 12c of the plurality of through holes 12 and first surface 21a and second surface 21b around the opening.

While conductive layer 22 may be formed by any methods, it is preferable to use a plating method (for example, an electroless plating method and electrolytic plating method) from the view point of forming conductive layer 22 with a small and uniform thickness without closing through hole 12.

Step 4

Then, the plurality of conductive layers 13 is formed by removing a part on first surface 21a side and a part on second surface 21b side of insulating sheet 21 (see FIG. 3D). These portions may be physically removed by cutting or the like, or may be chemically removed through chemical etching or the like, for example.

Note that the manufacturing method of anisotropic conductive sheet 10 may further include other steps as necessary. For example, after the step 4), a step 5) of removing the surface layer portion of first heat-resistant resin layer 11B and second heat-resistant resin layer 11C may be further performed.

Step 5

Plasma treatment may be provided on both surfaces of insulating sheet 21. In this manner, first heat-resistant resin layer 11B and second heat-resistant resin layer 11C are etched, and a shape in which conductive layer 13 is protruded is obtained (see FIG. 4). With such a shape, the resistance value is easily reduced upon connection with the inspection object, and stable connection can be easily achieved.

In addition, a step 6) of preprocessing for facilitating the formation of conductive layer 22 may be performed between the step 2) and the step 3).

Step 6

It is preferable to perform a desmear process (preprocessing) for facilitating the formation of conductive layer 22 for insulating sheet 21 where the plurality of through holes 12 is formed.

The desmear process is a process of removing the smear generated by laser processing, and is preferably an oxygen plasma treatment. For example, in the case where insulating sheet 21 is composed of a cross-linked silicone elastomer composition, oxygen plasma treatment on insulating sheet 21 can not only achieve ashing/etching, but also achieve formation of a silica film through oxidation of the silicone surface. The silica film can not only facilitate infiltration of plating liquid into through hole 12, but also increase the adhesion between the inner wall surface of through hole 12 and conductive layer 22.

The oxygen plasma treatment can be performed by using a plasma asher, a radio frequency plasma etching apparatus, or a micro wave plasma etching apparatus, for example.

The resulting anisotropic conductive sheet can be preferably used for electrical testing.

3. Electrical Testing Apparatus and Electrical Testing Method

Electrical Testing Apparatus

Figure 5:
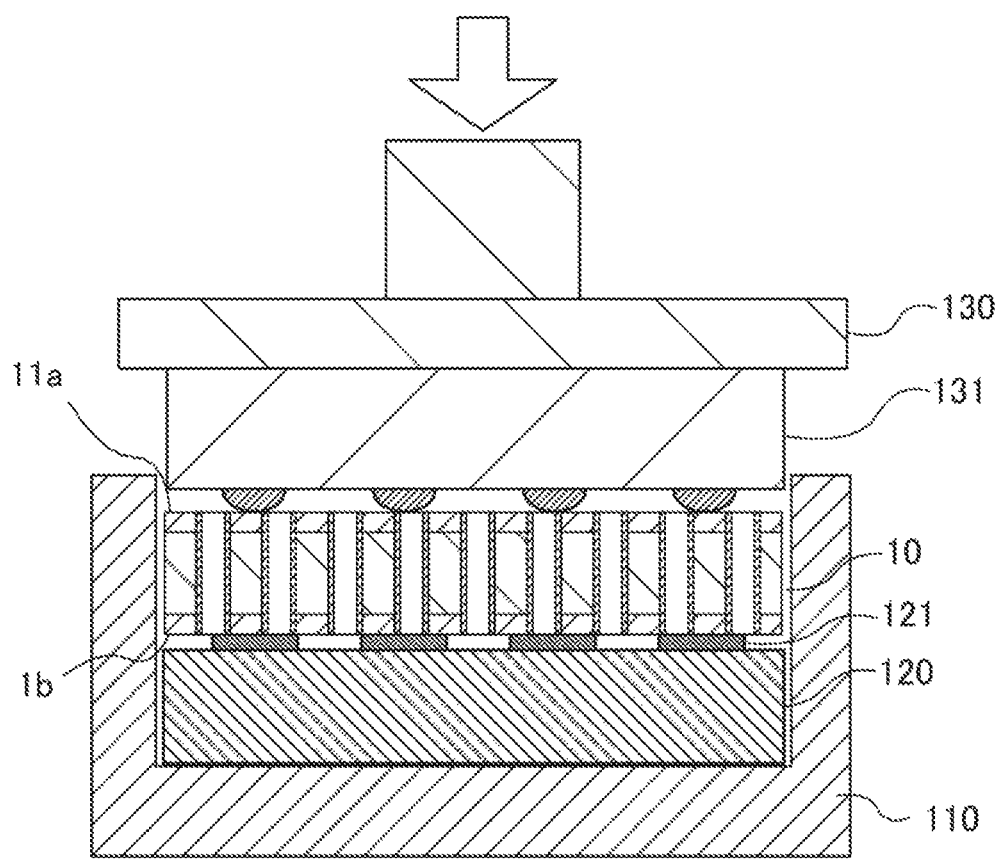
FIG. 5 is a sectional view illustrating an electrical testing apparatus according to Embodiment 1.

FIG. 5 is a sectional view illustrating an example of electrical testing apparatus 100 according to the present embodiment.

Electrical testing apparatus 100 is an apparatus that uses anisotropic conductive sheet 10 of FIG. 1B and inspects the electrical characteristics (such as conduction) between terminals 131 (measurement points) of inspection object 130, for example. Note that in this drawing, inspection object 130 is also illustrated from the viewpoint of describing the electrical testing method.

As illustrated in FIG. 5, electrical testing apparatus 100 includes holding container (socket) 110, inspection substrate 120, and anisotropic conductive sheet 10.

Holding container (socket) 110 is a container for holding inspection substrate 120, anisotropic conductive sheet 10 and the like.

Inspection substrate 120 is disposed in holding container 110, and includes a plurality of electrodes 121 that faces measurement points of inspection object 130 at the surface facing inspection object 130.

Anisotropic conductive sheet 10 is disposed on the surface where electrode 121 of inspection substrate 120 is disposed, such that the electrode 121 and conductive layer 13 on second surface 11b side in anisotropic conductive sheet 10 are in contact with each other.

Inspection object 130 is not limited, but examples of inspection object 130 include various semiconductor devices (semiconductor packages) such as such as HBM and PoP, electronic components, and printed boards. In the case where inspection object 130 is a semiconductor package, the measurement point may be a bump (terminal). In addition, in comparison with inspection object 130 is a printed board, the measurement point may be a component mounting land and a measuring land provided at the conductive pattern.

Electrical Testing Method

An electrical testing method using electrical testing apparatus 100 of FIG. 5 is described below.

As illustrated in FIG. 5, the electrical testing method according to the present embodiment includes a step of stacking inspection substrate 120 including electrode 121 and inspection object 130 through anisotropic conductive sheet 10, and electrically connecting electrode 121 of inspection substrate 120 and terminal 131 of inspection object 130 through anisotropic conductive sheet 10.

When the above-mentioned step is performed, electrode 121 of inspection substrate 120 and terminal 131 of inspection object 130 may be pressurized by pressing inspection object 130, or brought into contact with each other under heating atmosphere as necessary, from the viewpoint of facilitating sufficient conductivity through anisotropic conductive sheet 10.

As described above, anisotropic conductive sheet 10 includes the plurality of hollows 12' surrounded by conductive layer 13. In this manner, when anisotropic conductive sheet 10 is pressed in the thickness direction, it can be favorably deformed. In addition, insulation layer 11 includes elastic body layer 11A with high deformability, and second heat-resistant resin layer 11C and first heat-resistant resin layer 11B with high heat-resistance. In this manner, it is possible to reduce adhesion of the component of the insulation layer to the terminal of the inspection object under heating, fracture of conductive layer 13 due to expansion and contraction of insulation layer 11 and the like, and variation of the center-to-center distance of the plurality of through holes 12, while favorably and electrically connecting terminal 131 of inspection object 130 and electrode 121 of inspection substrate 120 of electrical testing apparatus 100.

Embodiment 2

1. Anisotropic Conductive Sheet

Anisotropic conductive sheet 10 according to the present embodiment relates to a second anisotropic conductive sheet of an embodiment of the present invention.

Figure 6A:
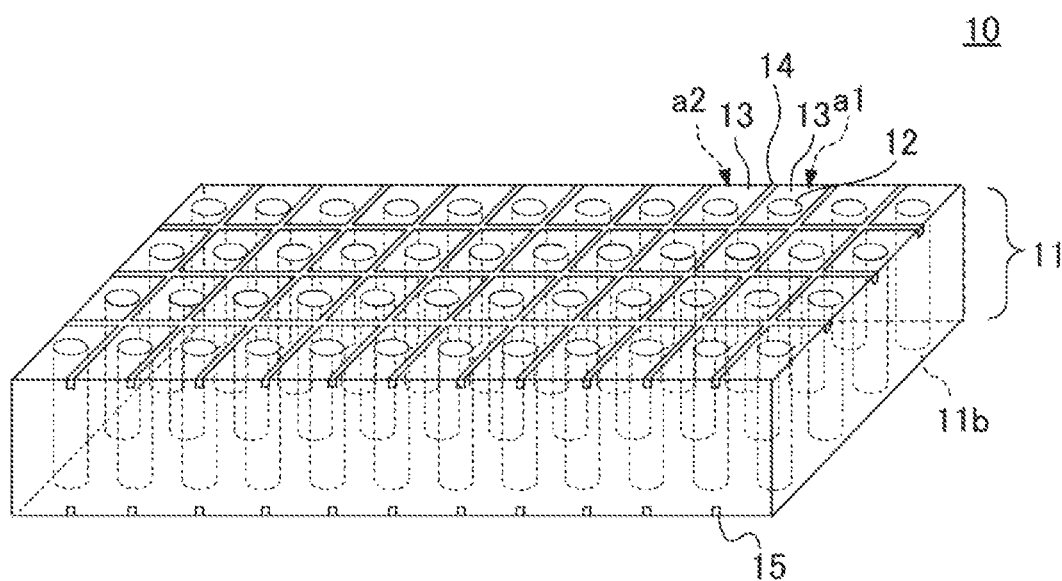
FIG. 6A is a perspective view illustrating an anisotropic conductive sheet according to Embodiment 2.
Figure 6B:
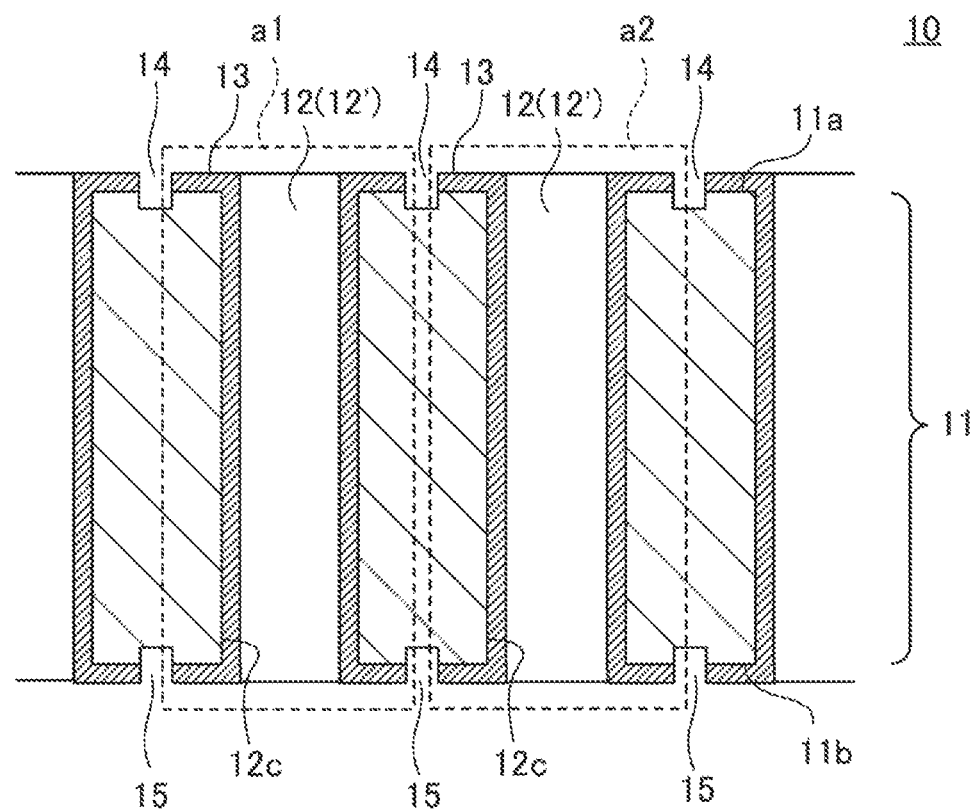
FIG. 6B is a partially enlarged view of a vertical cross section of the anisotropic conductive sheet of FIG. 6A.
Figure 7:
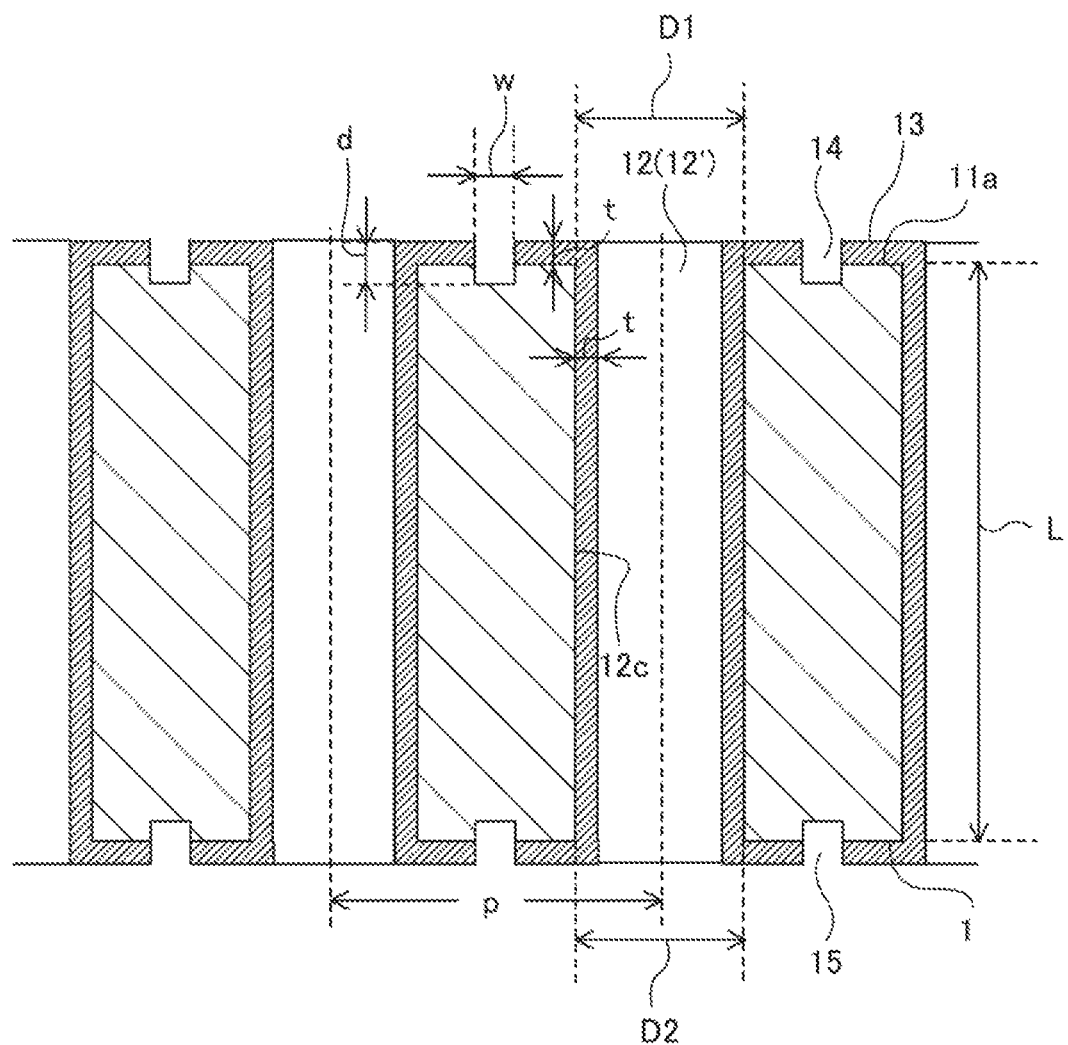
FIG. 7 is an enlarged view of FIG. 6B.

FIG. 6A is a perspective view illustrating anisotropic conductive sheet 10 according to Embodiment 2, FIG. 6B is a partially enlarged view of a vertical cross section (a partial sectional view along the thickness direction) of anisotropic conductive sheet 10 of FIG. 6A. FIG. 7 is an enlarged view of FIG. 6B.

As illustrated in FIGS. 6A and 6B, anisotropic conductive sheet 10 according to the present embodiment has the same configuration as the above-mentioned Embodiment 1 except that insulation layer 11 is composed of a single layer, that the plurality of conductive layers 13 is disposed also on first surface 11a and second surface 11b of insulation layer 11, and that a plurality of first groove parts 14 and a plurality of second groove parts 15 disposed between the plurality of conductive layers 13 are further provided.

Specifically, anisotropic conductive sheet 10 according to the present embodiment includes insulation layer 11 including the plurality of through holes 12, the plurality of conductive layers 13 disposed corresponding to the plurality of through holes 12 (see, for example, two conductive layers 13 surrounded by the broken line in FIG. 1B), the plurality of first groove parts 14 and the plurality of second groove parts 15 disposed between the plurality of conductive layers 13.

1-1. Insulation Layer 11

Insulation layer 11 may further include other layers as long as it includes at least an elastic body layer and the overall elasticity is not compromised. In the present embodiment, insulation layer 11 has the same configuration as insulation layer 11 of Embodiment 1 except that it is composed of an elastic body layer composed of a cross-linked elastomer composition.

The elastomer composition making up insulation layer 11 is the same as the elastomer composition making up elastic body layer 11A of Embodiment 1. That is, the elastomer and the optional crosslinking agent in the elastomer composition making up insulation layer 11 are the same as the elastomer and the optional crosslinking agent described in Embodiment 1.

Through hole 12 is also the same as through hole 12 of Embodiment 1.

1-2. Conductive Layer 13

Conductive layer 13 is disposed corresponding to through hole 12 (or hollow 12') (see FIG. 6B). More specifically, conductive layer 13 is continuously disposed at inner wall surface 12c of through hole 12, the periphery of the opening of through hole 12 on a first surface 11a, and the periphery of the opening of through hole 12 on second surface 11b. Then, conductive layer 13 of the unit surrounded by the broken line functions as a single conductive path (see FIG. 6B). Then, adjacent two conductive layers 13 (for example, in FIG. 6B, conductive layers 13 (a1) and 13 (a2) surrounded by the broken line) are insulated with first groove part 14 and second groove part 15 (see FIG. 6B).

The thickness of conductive layer 13 is not limited as long as sufficient conduction can be achieved and the plurality of conductive layers 13 does not make contact with each other with first groove part 14 or second groove part 15 sandwiched therebetween when pressed in the thickness direction of insulation layer 11. More specifically, preferably, the thickness of conductive layer 13 is smaller than the width and the depth of first groove part 14 and second groove part 15.

More specifically, the thickness of conductive layer 13 may be 0.1 to 5 μm. When the thickness of conductive layer 13 has a certain value or greater, sufficient conduction is easily achieved, whereas when the thickness has a value smaller than a certain value, through hole 12 may be closed or the terminal of the inspection object may be damaged due to contact with conductive layer 13. Note that thickness t of conductive layer 13 is the thickness in the direction parallel to the thickness direction of insulation layer 11 on first surface 11a and second surface 11b, and is the thickness in the direction orthogonal to the thickness direction of insulation layer 11 on inner wall surface 12c of through hole 12 (see FIG. 7).

The circle equivalent diameter of hollow 12' surrounded by conductive layer 13 on first surface 11a side is obtained by subtracting the thickness of conductive layer 13 from circle equivalent diameter D1 of the opening of through hole 12 on first surface 11a side, and may be, for example, 1 to 330 μm.

The material and the volume resistivity of conductive layer 13 are the same as the material and the volume resistivity of conductive layer 13 in the above-mentioned Embodiment 1.

1-3. First Groove Part 14 and Second Groove Part 15

First groove part 14 and second groove part 15 grooves (valley lines) formed in one surface and the other surface of anisotropic conductive sheet 10, respectively. More specifically, first groove part 14 is disposed between the plurality of conductive layers 13 on first surface 11a to insulate therebetween. Second groove part 15 is disposed between the plurality of conductive layers 13 on second surface 11b to insulate therebetween.

The cross-sectional shape of first groove part 14 (or second groove part 15) in the direction orthogonal to the extending direction is not limited, and may be a rectangular shape, a semicircular shape, a U shape, and a V shape. In the present embodiment, the cross-sectional shape of first groove part 14 (or second groove part 15) is a rectangular shape.

Preferably, width w and depth d of first groove part 14 (or second groove part 15) are set to values with which conductive layer 13 on one side and conductive layer 13 on the other side do not make contact with each other through first groove part 14 (or second groove part 15) when anisotropic conductive sheet 10 is pressed in the thickness direction.

More specifically, when anisotropic conductive sheet 10 is pressed in the thickness direction, conductive layer 13 on one side and conductive layer 13 on the other side tend to approach and make contact with each other through first groove part 14 (or second groove part 15). In view of this, preferably, width w of first groove part 14 (or second groove part 15) is greater than the thickness of conductive layer 13, and is 2 to 40 times the thickness of conductive layer 13.

Width w of first groove part 14 (or second groove part 15) is the maximum width in the direction orthogonal to the extending direction of first groove part 14 (or second groove part 15) in first surface 11a (or second surface 11b) (see FIG. 7).

Depth d of first groove part 14 (or second groove part 15) may be the same as, or greater than the thickness of conductive layer 13. That is, the deepest part of first groove part 14 (or second groove part 15) may be located at first surface 11a of insulation layer 11, or located inside insulation layer 11. In particular, from the viewpoint of easily setting a range where conductive layer 13 on one side and conductive layer 13 on the other side with first groove part 14 (or second groove part 15) sandwiched therebetween do not contact with each other, depth d of first groove part 14 (or second groove part 15) is preferably greater than the thickness of conductive layer 13, more preferably 1.5 to 20 times the thickness of conductive layer 13 (see FIG. 7).

Depth d of first groove part 14 (or second groove part 15) is the depth from the surface of conductive layer 13 to the deepest part in the direction parallel to the thickness direction of insulation layer 11 (see FIG. 7).

Width w and depth d of first groove part 14 and second groove part 15 may be identical to each other or different from each other.

1-4. Effects

Anisotropic conductive sheet 10 of the present embodiment (the second anisotropic conductive sheet of the embodiment of the present invention) includes the plurality of hollows 12' surrounded by conductive layer 13 (hollow derived from through hole 12). In this manner, when a pressure is applied in the thickness direction of anisotropic conductive sheet 10, it can be favorably deformed. In addition, anisotropic conductive sheet 10 includes conductive layer 13 not only at inner wall surface 12c of through hole 12, but also at first surface 11a and second surface 11b of insulation layer 11 (or the surface of anisotropic conductive sheet 10). In this manner, during electrical testing, electrical contact can be reliably performed when sandwiched and pressurized between the electrode of the inspection substrate and the terminal of the inspection object.

2. Manufacturing Method for Anisotropic Conductive Sheet

FIGS. 8A to 8D are schematic cross-sectional views illustrating a manufacturing method of anisotropic conductive sheet 10 according to the present embodiment.

Anisotropic conductive sheet 10 according to the present embodiment is manufactured in the same manner as the above-mentioned Embodiment 1 except that, for example, in the manufacturing method of anisotropic conductive sheet 10 in the above-mentioned Embodiment 1, a sheet composed of an elastic body layer is used as insulating sheet 21, and the step of 4) is replaced by a step 4) of forming the plurality of conductive layers 13 by forming first groove part 14 and second groove part 15 at first surface 21a and second surface 21b of insulating sheet 21, respectively (see FIGS. 8A to 8D).

At the step 4), the plurality of first groove parts 14 and the plurality of second groove parts 15 are formed at the first surface and the second surface of insulating sheet 21, respectively (see FIG. 8D). In this manner, conductive layer 22 can be set as the plurality of conductive layers 13 provided at each through hole 12 (see FIG. 8D).

The plurality of first groove parts 14 and second groove part 15 may be formed by any methods. For example, it is preferable to form the plurality of first groove parts 14 and the plurality of second groove parts 15 by a laser processing method. In the present embodiment, in first surface 21a (or second surface 21b), the plurality of first groove parts 14 (or the plurality of second groove parts 15) may be formed in a cross shape.

The resulting anisotropic conductive sheet 10 can be preferably used for electrical testing.

As described above, anisotropic conductive sheet 10 includes the plurality of hollows 12' surrounded by conductive layer 13. In this manner, when anisotropic conductive sheet 10 is pressed in the thickness direction, it can be favorably deformed. In addition, conductive layer 13 is disposed also on first surface 11a and second surface 11b, the contact resistance can be reduced. In this manner, electrode 121 of inspection substrate 120 of electrical testing apparatus 100 and terminal 131 of inspection object 130 can be favorably electrically connected with each other.

Modification

Note that while an example of anisotropic conductive sheet 10 illustrated in FIGS. 1 and 6 is described in the above-mentioned Embodiments 1 and 2, this is not limitative.

Specifically, while FIGS. 1A and 1B of the above-mentioned of Embodiment 1 illustrate an example in which the end portion of conductive layer 13 on first surface 11a side (or the end portion on second surface 11b side) is not protruded from first surface 11a (or second surface 11b), this is not limitative, and the end portion of conductive layer 13 on first surface 11a side (or the end portion on second surface 11b side) may be protruded from first surface 11a (or second surface 11b) as illustrated in FIG. 4.

Figure 9A:
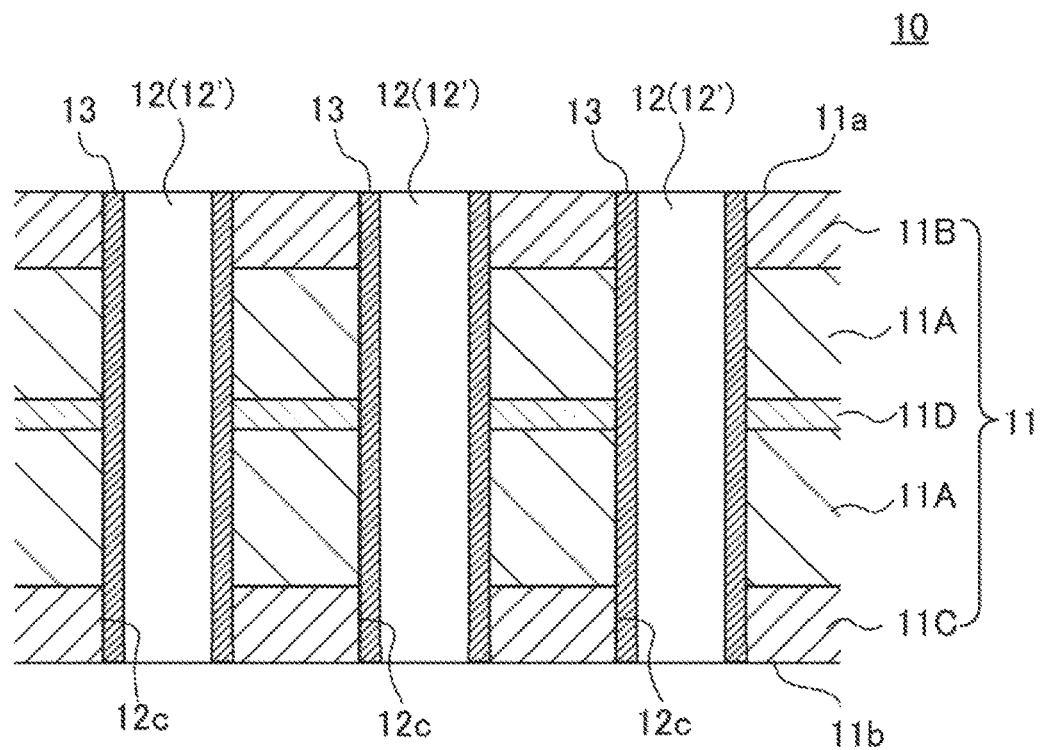
FIGS. 9A and 9B are partial sectional views illustrating an anisotropic conductive sheet according to a modification.
Figure 9B:
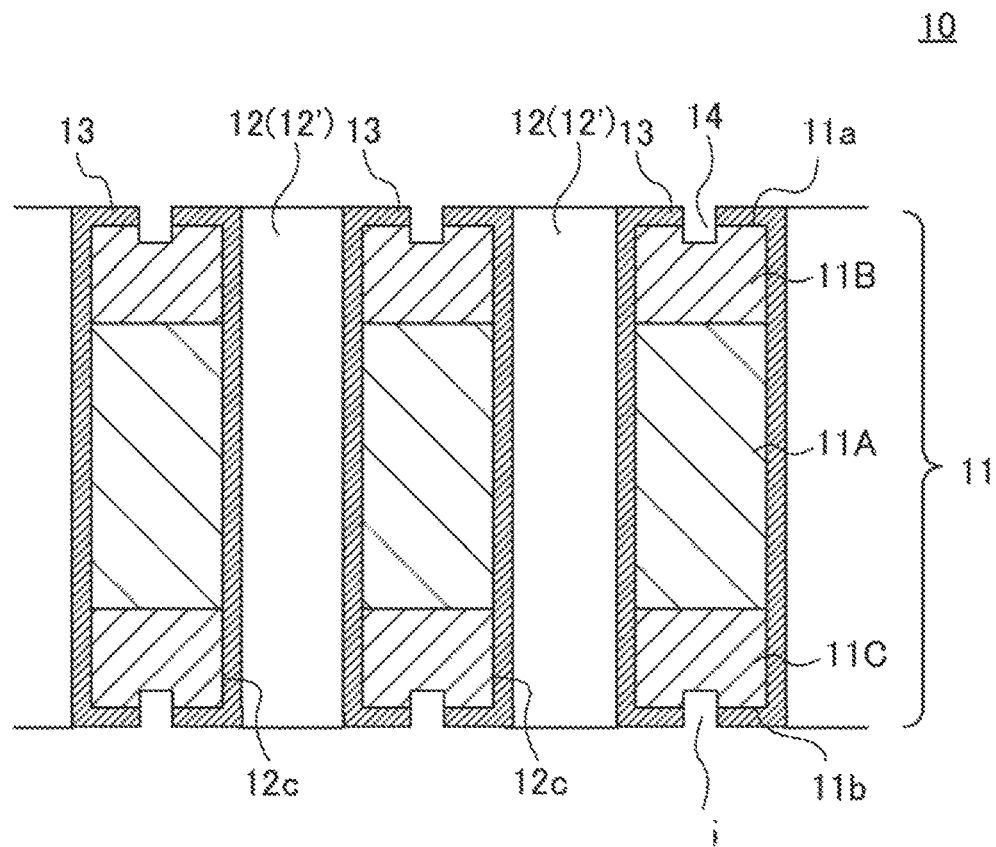

FIGS. 9A and 9B are partially enlarged sectional views illustrating anisotropic conductive sheet 10 according to a modification. Specifically, while insulation layer 11 includes one elastic body layer 11A in the above-mentioned Embodiment 1, this is not limitative, and insulation layer 11 may include a plurality of elastic body layers 11A (see FIG. 9A). In addition, insulation layer 11 may further include bonding layer 11D between two elastic body layers 11A (see FIG. 9A).

In addition, while insulation layer 11 includes first heat-resistant resin layer 11B (including first surface 11a), elastic body layer 11A and second heat-resistant resin layer 11C (including second surface 11b) in this order in FIGS. 1A and 1B of the above-mentioned of Embodiment 1, insulation layer 11 may include first elastic body layer 11A (including first surface 11a), heat-resistant resin layer 11B, and second elastic body layer 11A (including second surface 11b) in this order. In this case, the compositions or the physical properties of first elastic body layer 11A and second elastic body layer 11A may be identical to each other or different from each other.

In addition, while conductive layer 13 is disposed only on inner wall surface 12c of through hole 12 in the above-mentioned Embodiment 1, this is not limitative. For example, conductive layer 13 may be continuously disposed on first surface 11a and second surface 11b, and the plurality of first groove parts 14 and second groove part 15 for insulating between the plurality of conductive layers 13 on first surface 11a and second surface 11b may be further provided (see FIG. 9B). First groove part 14 and second groove part 15 may be the same as first groove part 14 and second groove part 15, respectively in Embodiment 2. This anisotropic conductive sheet 10 is the same as anisotropic conductive sheet 10 according to Embodiment 2, except that insulation layer 11 is configured to include elastic body layer 11A, first heat-resistant resin layer 11B, and second heat-resistant resin layer 11C.

Figure 10A:
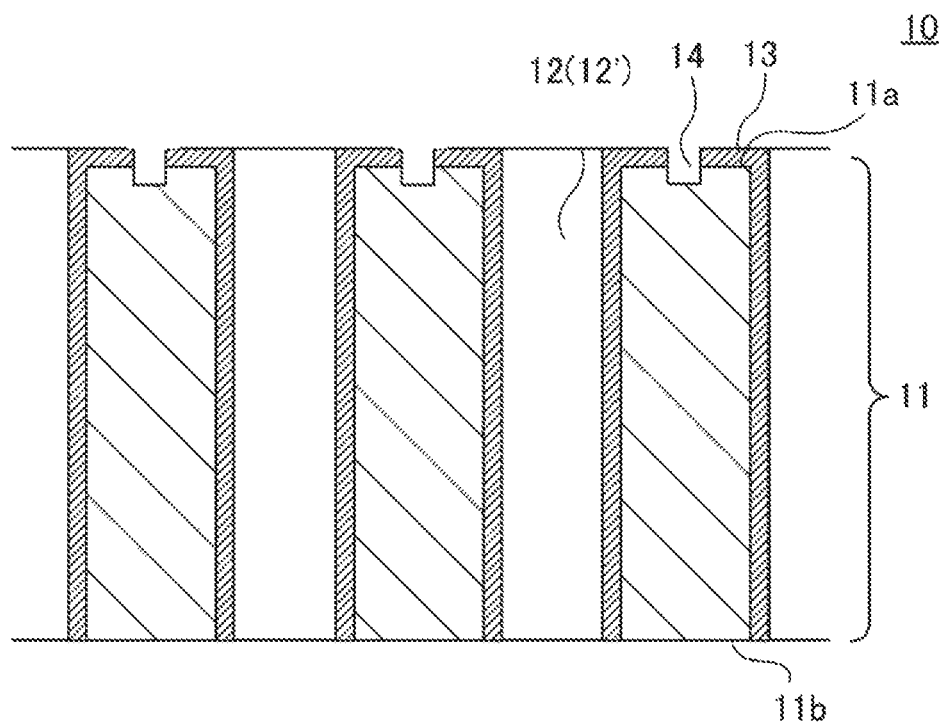
FIGS. 10A and 10B are partial sectional views illustrating an anisotropic conductive sheet according to a modification.
Figure 10B:
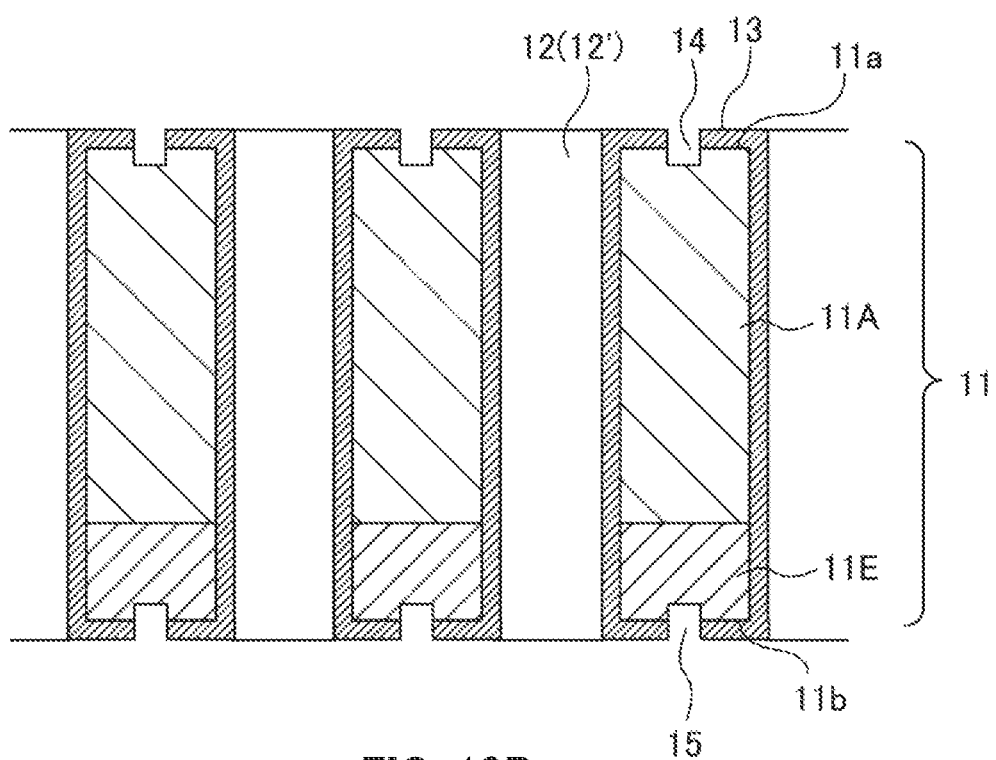
Figure 11:
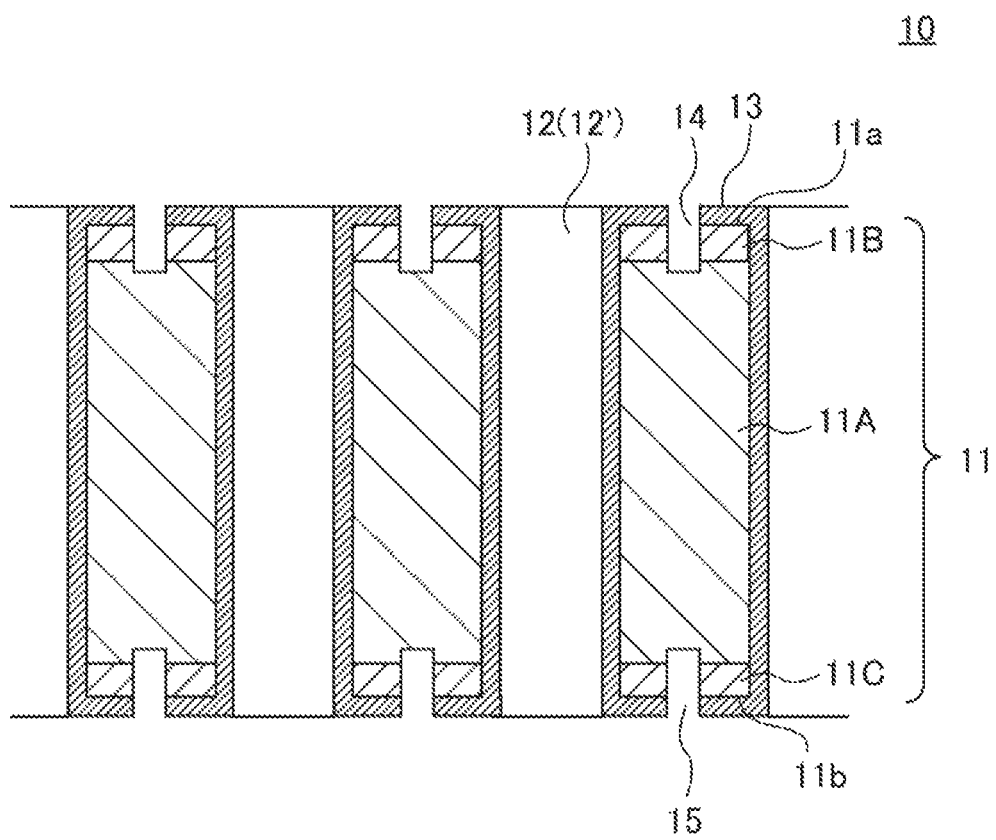
FIG. 11 is a partial sectional view illustrating an anisotropic conductive sheet according to a modification.

FIGS. 10A, 10B and 11 are partial sectional views illustrating anisotropic conductive sheet 10 according to a modification. Specifically, while conductive layer 13 is disposed at both first surface 11a of insulation layer 11 and second surface 11b in the above-mentioned Embodiment 2 (see FIG. 6B), this is not limitative, and conductive layer 13 may be disposed at only first surface 11a of insulation layer 11 (see FIG. 10A).

In addition, while insulation layer 11 is composed of an elastic body layer in the above-mentioned Embodiment 2, this is not limitative, and insulation layer 11 may further include other layers as long as it can elastically deform. For example, insulation layer 11 may include elastic body layer 11A including first surface 11a (or second surface 11b) and heat-resistant resin layer 11E including second surface 11b (or first surface 11a) (see FIG. 10B). The heat-resistant resin composition making up heat-resistant resin layer 11E may be the same as the heat-resistant resin composition in Embodiment 1.

In addition, a plurality of heat-resistant resin layers may be provided. Specifically, in the above-mentioned Embodiment 2, insulation layer 11 may include first heat-resistant resin layer 11B including first surface 11a and second heat-resistant resin layer 11C including second surface 11b, and, elastic body layer 11A disposed therebetween (see FIG. 11). In this case, preferably, the depth of first groove part 14 is greater than the thickness of first heat-resistant resin layer 11B and the depth of second groove part 15 is greater than the thickness of second heat-resistant resin layer 11C.

Specifically, the heat-resistant resin layers such as first heat-resistant resin layer 11B and second heat-resistant resin layer 11C have an elastic modulus higher than that of elastic body layer 11A. As such, if the depths of first groove part 14 and second groove part 15 are small, first heat-resistant resin layer 11B and second heat-resistant resin layer 11C are not completely divided, and, when inspection object 130 is put and pushed on anisotropic conductive sheet 10, the surrounding conductive layer 13 tends to be pushed together.

Conversely, by completely dividing first heat-resistant resin layer 11B and second heat-resistant resin layer 11C by providing first groove part 14 and second groove part 15 with large depths as described above, the situation where the surrounding conductive layer 13 is pushed together when inspection object 130 is put and pushed can be prevented, and the influence on the surrounding conductive layer 13 can be reduced. Since the surrounding conductive layer 13 is not affected, the electrical connection between each terminal and each conductive layer 13 can be sufficiently achieved even when the height of each terminal (such as bumps and lands) of inspection object 130 are largely varied.

In addition, also in the above-mentioned Embodiment 2, insulation layer 11 may include first elastic body layer 11A (including first surface 11a), heat-resistant resin layer 11B, and second elastic body layer 11A (including second surface 11b) in this order as in FIG. 11 in the above-mentioned of Embodiment 1.

Also in the above-mentioned cases, preferably, the thickness of the heat-resistant resin layer (heat-resistant resin layer 11E, first heat-resistant resin layer 11B, and second heat-resistant resin layer 11C) is smaller than the thickness of elastic body layer 11A (see FIGS. 10B and 11) from the viewpoint of making the elasticity of insulation layer 11 less impaired as in the above-mentioned Embodiment 1.

In addition, while the anisotropic conductive sheet is used for electrical testing in the above-mentioned Embodiments 1 and 2, this is not limitative, and the anisotropic conductive sheet may be used for electrical connection between two electronic members, such as electrical connection between a glass substrate and a flexible printed board, and electrical connection between a substrate and an electronic component mounted to it.

This application is entitled to and claims the benefit of Japanese Patent Application No. 2019-211816 filed on Nov. 22, 2019, the disclosure each of which including the specification, drawings and abstract is incorporated herein by reference in its entirety.

INDUSTRIAL APPLICABILITY

According to the present invention, first, it is possible to provide an anisotropic conductive sheet that can sufficiently elastically deform in the thickness direction, with a favorable heat resisting property. In addition, second, it is possible to provide an anisotropic conductive sheet that can sufficiently elastically deform in the thickness direction and can perform sufficient electrical connection between a substrate of an electrical testing apparatus and an inspection object, with a low electric resistance.

REFERENCE SIGNS LIST

10 Anisotropic conductive sheet
11 Insulation layer
11a First surface
11b Second surface
11A Elastic body layer
11B First heat-resistant resin layer
11C Second heat-resistant resin layer
11D Bonding layer
11E Heat-resistant resin layer
12 Through hole
12c Inner wall surface
13 Conductive layer
14 First groove part
15 Second groove part
21 Insulating sheet
22 Conductive layer
100 Electrical testing apparatus
110 Holding container
120 Inspection substrate
121 Electrode
130 Inspection object
131 Terminal (of inspection object)

What is claimed is:
1. An anisotropic conductive sheet comprising:
an insulation layer with elasticity including a first surface located on one side in a thickness direction, a second surface located on another side in the thickness direction, and a plurality of through holes extending between the first surface and the second surface; and
a plurality of conductive layers disposed at inner wall surfaces of the plurality of through holes,
wherein the insulation layer includes:
an elastic body layer comprising a cross-linked elastomer composition, and
a heat-resistant resin layer comprising a heat-resistant resin composition with a glass transition temperature higher than that of the cross-linked elastomer composition.
2. The anisotropic conductive sheet according to claim 1, wherein the heat-resistant resin layer includes:
a first heat-resistant resin layer including the first surface, and comprising the heat-resistant resin composition; and
a second heat-resistant resin layer including the second surface, and comprising the heat-resistant resin composition,
wherein the elastic body layer is disposed between the first heat-resistant resin layer and the second heat-resistant resin layer.
3. The anisotropic conductive sheet according to claim 2, wherein a ratio Tb/Tc of thickness Tb of the first heat-resistant resin layer to thickness Tc of the second heat-resistant resin layer is 0.8 to 1.2.
4. The anisotropic conductive sheet according to claim 2, wherein a thickness of the first heat-resistant resin layer or a thickness of the second heat-resistant resin layer is smaller than a thickness of the elastic body layer.
5. The anisotropic conductive sheet according to claim 1, wherein each of the plurality of conductive layers is continuously disposed from the inner wall surface of each of the plurality of through holes to a periphery of an opening of each of the plurality of through holes on the first surface; and wherein the anisotropic conductive sheet further comprises a plurality of first groove parts disposed between the plurality of conductive layers on the first surface and configured to insulate the plurality of conductive layers.

6. An anisotropic conductive sheet comprising:

an insulation layer with elasticity including a first surface located on one side in a thickness direction, a second surface located on another side in the thickness direction, and a plurality of through holes extending between the first surface and the second surface;

a plurality of conductive layers disposed continuously to an inner wall surface of each of the plurality of through holes and a periphery of an opening of each of the plurality of through holes on the first surface in the plurality of through holes; and a plurality of first groove parts disposed between the plurality of conductive layers on the first surface, and configured to insulate the plurality of conductive layers.

7. The anisotropic conductive sheet according to claim 6, wherein the plurality of first groove parts are valley lines.

8. The anisotropic conductive sheet according to claim 6, wherein a width of each of the plurality of first groove parts is greater than a thickness of each of the plurality of conductive layers.

9. The anisotropic conductive sheet according to claim 6, wherein a depth of each of the plurality of first groove parts is greater than a thickness of each of the plurality of conductive layers.

10. The anisotropic conductive sheet according to claim 6, wherein the plurality of conductive layers is further disposed around the plurality of through holes on the second surface; and wherein the anisotropic conductive sheet further comprises a plurality of second groove parts disposed between the plurality of conductive layers on the second surface, and configured to insulate the plurality of conductive layers.

11. The anisotropic conductive sheet according to claim 10, wherein a width of each of the plurality of second groove parts is greater than a thickness of each of the plurality of conductive layers.

12. The anisotropic conductive sheet according to claim 10, wherein a depth of each of the plurality of second groove parts is greater than a thickness of each of the plurality of conductive layers.

13. The anisotropic conductive sheet according to claim 6, wherein the insulation layer includes an elastic body layer comprising a cross-linked elastomer composition.

14. The anisotropic conductive sheet according to claim 13, wherein the insulation layer further includes:

a first heat-resistant resin layer including the first surface, and comprising a heat-resistant resin composition with a glass transition temperature higher than that of the cross-linked elastomer composition; and a second heat-resistant resin layer including the second surface, and comprising a heat-resistant resin composition with a glass transition temperature higher than that of the cross-linked elastomer composition; and wherein the elastic body layer is disposed between the first heat-resistant resin layer and the second heat-resistant resin layer.

15. The anisotropic conductive sheet according to claim 14, wherein a depth of each of the plurality of first groove parts is greater than a thickness of the first heat-resistant resin layer.

16. The anisotropic conductive sheet according to claim 14, wherein a depth of each of the plurality of second groove parts is greater than a thickness of the second heat-resistant resin layer.

17. The anisotropic conductive sheet according to claim 6, wherein a center-to-center distance of openings of the plurality of through holes on the first surface side is 5 to 55 μm.

18. The anisotropic conductive sheet according to claim 6, wherein a ratio D1/D2 of a circle equivalent diameter D1 of an opening of each of the plurality of through holes on the first surface side to a circle equivalent diameter D2 of an opening of each of the plurality of through holes on the second surface side is 0.7 to 1.5.

19. The anisotropic conductive sheet according to claim 6 that is an anisotropic conductive sheet used for electrical testing of an inspection object, wherein the inspection object is disposed on the first surface.

20. An electrical testing apparatus, comprising:

an inspection substrate including a plurality of electrodes; and the anisotropic conductive sheet according to claim 6 disposed on a surface where the plurality of electrodes is disposed in the inspection substrate.

21. An electrical testing method, comprising:

stacking an inspection substrate including a plurality of electrodes and an inspection object including a terminal through the anisotropic conductive sheet according to claim 6, and electrically connecting the plurality of electrodes of the inspection substrate and the terminal of the inspection object through the anisotropic conductive sheet.

* * * * *